(12) United States Patent
Lee et al.

(10) Patent No.: US 11,793,044 B2
(45) Date of Patent: Oct. 17, 2023

(54) DISPLAY DEVICE AND MANUFACTURING METHOD THEREOF

(71) Applicant: SAMSUNG DISPLAY CO., LTD., Yongin-si (KR)

(72) Inventors: Dong Min Lee, Anyang-si (KR); Sang Woo Sohn, Yongin-si (KR); Do Keun Song, Yongin-si (KR); Sang Won Shin, Yongin-si (KR); Hyun Eok Shin, Gwacheon-si (KR); Su Kyoung Yang, Hwaseong-si (KR); Kyeong Su Ko, Hwaseong-si (KR); Sang Gab Kim, Seoul (KR); Joon Geol Lee, Jeollabuk-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 182 days.

(21) Appl. No.: 16/704,437

(22) Filed: Dec. 5, 2019

(65) Prior Publication Data

US 2020/0235196 A1 Jul. 23, 2020

(30) Foreign Application Priority Data

Jan. 17, 2019 (KR) .................. 10-2019-0006374

(51) Int. Cl.
*H10K 59/131* (2023.01)
*H01L 27/12* (2006.01)
*H01L 21/02* (2006.01)

(52) U.S. Cl.
CPC ..... *H10K 59/1315* (2023.02); *H01L 27/1259* (2013.01); *H01L 21/02068* (2013.01)

(58) Field of Classification Search
None
See application file for complete search history.

(56) References Cited

U.S. PATENT DOCUMENTS 5,439,574 A * 8/1995 Kobayashi ............ C23C 14/351
204/192.12
7,619,254 B2 * 11/2009 Lee ...................... H01L 27/124
257/72

(Continued)

FOREIGN PATENT DOCUMENTS

CN 109671717 A * 4/2019 ....... H01L 21/02186
JP 2004-282066 10/2004

(Continued)

OTHER PUBLICATIONS

Byun, et al., "Formation of a Large Grain Sized TiN Layer Using TiNx, the Epitaxial Continuity at the Al/TiN Interface, and its Electromigration Endurance in Multilayered Interconnection", J. Appl. Phys., 78 (3), Aug. 1, 1995, pp. 1719-1724.

*Primary Examiner* — Telly D Green
(74) *Attorney, Agent, or Firm* — F. CHAU & ASSOCIATES, LLC

(57) ABSTRACT

Provided is a display device. The display device includes: a substrate; a gate line disposed on the substrate; a transistor including a part of the gate line; and a light-emitting element connected to the transistor, in which the gate line includes a first layer including aluminum or an aluminum alloy, a second layer including titanium nitride, and a third layer including metallic titanium nitride. An N/Ti molar ratio of the metallic titanium nitride may be in a range from about 0.2 to about 0.75.

6 Claims, 20 Drawing Sheets

(56) References Cited

U.S. PATENT DOCUMENTS

| | | | |
|---|---|---|---|
| 9,184,223 B2* | 11/2015 | Kim | H01L 27/1262 |
| 9,312,190 B2* | 4/2016 | Choi | H01L 27/0922 |
| 9,401,394 B2* | 7/2016 | Kim | H01L 27/3276 |
| 9,673,272 B2 | 6/2017 | Choi et al. | |
| 10,032,880 B2* | 7/2018 | Constant | H01L 29/2003 |
| 10,283,565 B1* | 5/2019 | Xu | H01L 45/1683 |
| 10,409,159 B2 | 9/2019 | Zhao et al. | |
| 10,522,594 B2* | 12/2019 | Xu | H01L 21/76897 |
| 2005/0072973 A1* | 4/2005 | Kim | H01L 27/12 257/E29.151 |
| 2007/0013078 A1* | 1/2007 | Lee | H01L 23/53238 257/762 |
| 2007/0040954 A1* | 2/2007 | Lee | H01L 27/124 349/43 |
| 2007/0120476 A1* | 5/2007 | Park | H01L 27/1248 313/506 |
| 2008/0179596 A1* | 7/2008 | Cho | H01L 29/78675 257/59 |
| 2009/0261354 A1* | 10/2009 | Ha | H01L 51/5278 257/87 |
| 2010/0155730 A1* | 6/2010 | Hong | H01L 27/1225 257/59 |
| 2011/0114940 A1* | 5/2011 | Kim | H01L 27/1214 257/43 |
| 2012/0104405 A1* | 5/2012 | Choi | H01L 27/1255 257/72 |
| 2012/0112181 A1* | 5/2012 | Lee | H01L 27/1225 257/43 |
| 2012/0169229 A1* | 7/2012 | You | H01L 51/5253 315/51 |
| 2013/0075833 A1* | 3/2013 | Liu | H01L 29/4966 257/411 |
| 2013/0299817 A1* | 11/2013 | Park | H01L 29/78618 257/43 |
| 2014/0001565 A1* | 1/2014 | Choi | H01L 21/823828 257/369 |
| 2014/0131682 A1* | 5/2014 | Kim | H01L 27/3244 257/40 |
| 2014/0159002 A1* | 6/2014 | Lee | H01L 51/5256 257/40 |
| 2014/0183651 A1* | 7/2014 | Lee | H01L 27/092 257/369 |
| 2014/0225195 A1* | 8/2014 | Kim | H01L 29/7869 257/347 |
| 2014/0284564 A1* | 9/2014 | Kim | H01L 27/124 257/40 |
| 2014/0361272 A1* | 12/2014 | Joo | H01L 51/5088 257/40 |
| 2015/0069382 A1* | 3/2015 | Ahn | H01L 27/1262 257/43 |
| 2015/0187959 A1* | 7/2015 | Yoon | H01L 29/78633 257/43 |
| 2016/0013436 A1* | 1/2016 | Im | H01L 51/0017 257/40 |
| 2016/0020151 A1* | 1/2016 | Choi | H01L 21/28008 438/592 |
| 2016/0049457 A1* | 2/2016 | Kim | H01L 27/124 438/29 |
| 2016/0315098 A1* | 10/2016 | Im | H01L 27/3276 |
| 2018/0151628 A1* | 5/2018 | Park | H01L 27/3211 |
| 2018/0151824 A1* | 5/2018 | Park | H01L 51/5004 |
| 2018/0151850 A1* | 5/2018 | Lee | H01L 27/3246 |
| 2018/0158882 A1* | 6/2018 | Kim | G09G 3/3291 |
| 2018/0164933 A1* | 6/2018 | Jun | G06F 3/0445 |
| 2018/0188866 A1* | 7/2018 | Heo | H01L 27/323 |
| 2019/0036063 A1* | 1/2019 | Lee | H01L 51/5246 |
| 2019/0094633 A1* | 3/2019 | Song | H01L 27/124 |
| 2019/0198571 A1* | 6/2019 | Xu | H01L 45/1683 |
| 2019/0204638 A1* | 7/2019 | Park | G02F 1/1333 |
| 2020/0194719 A1* | 6/2020 | Choi | G09F 9/301 |

FOREIGN PATENT DOCUMENTS

| | | |
|---|---|---|
| JP | 2009-021635 | 1/2009 |
| JP | 2009200355 A * | 9/2009 |
| JP | 5176217 | 4/2013 |
| JP | 2017-522613 | 8/2017 |
| KR | 100400280 B1 * | 12/2003 |
| KR | 20130007163 A * | 1/2013 |

* cited by examiner

DISPLAY DEVICE AND MANUFACTURING METHOD THEREOF

CROSS-REFERENCE TO RELATED APPLICATION

This application claims priority under 35 U.S.C. § 119 to and the benefit of Korean Patent Application No. 10-2019-0006374, filed on Jan. 17, 2019, in the Korean Intellectual Property Office, the entire contents of which are herein incorporated by reference.

TECHNICAL FIELD

The present disclosure relates to a display device and a manufacturing method thereof, and more particularly, to a display device including an aluminum wire capped with a metallic TiNx and a manufacturing method thereof.

DISCUSSION OF RELATED ART

An active-mode emissive display device is composed of a light-emitting element (a light emitting diode) including an anode (a hole injection electrode), an emission layer, and a cathode (an electron injection electrode), and a thin film transistor driving the light-emitting element. Electrons and holes are injected into the emission layer from the anode and the cathode, respectively, and when exitons, that are formed by coupling of the holes and electrons that are injected into the emission layer, drop from an excited state to a ground state, light is emitted. The image displayed by the display device is realized through the light emitting. The display device includes driving wires such as a gate line and a data line. Such driving wires may have a multi-layered structure and may include different materials for each layer. Improper material choice and/or structure design for these driving wires may degrade the performance of the display device and/or cause the display device to lose reliability.

SUMMARY

Exemplary embodiments of the present invention provide a display device and a manufacturing method thereof that prevent an undercut in a hillock of a wire, prevent diffusion and the need for cleaning processes at an interface, and reduce particle generation during the manufacturing process.

A display device according to an exemplary embodiment of the present invention includes: a substrate; a gate line disposed on the substrate; a transistor including a part of the gate line; and a light-emitting element connected to the transistor, in which the gate line includes: a first layer including aluminum or an aluminum alloy; a second layer including titanium nitride; and a third layer including a metallic titanium nitride, in which an N/Ti molar ratio of the metallic titanium nitride is in a range from about 0.2 to about 0.75.

An N/Ti molar ratio of the titanium nitride of the second layer may be in a range from about 0.8 to about 1.2.

The aluminum alloy of the first layer may include at least one among Ni, La, Nd, and Ge.

A content of a material except for aluminum in the aluminum alloy may be 1 mol % or less.

A thickness of the second layer may be in a range from about 50 Å to about 400 Å thickness of the third layer may be in a range from about 200 Å to about 1200 Å.

The first layer may be closer to the substrate than the third layer.

A content of titanium included in the third layer may be larger than a content of titanium included in the second layer.

The gate line may not include a layer made of titanium alone.

A display device according to an exemplary embodiment of the present invention includes: a substrate; a gate line disposed on the substrate; a transistor including a part of the gate line; and a light-emitting element connected to the transistor, in which the gate line includes: a first layer including aluminum or an aluminum alloy; and a second layer including a metallic titanium nitride, in which an N/Ti molar ratio of the metallic titanium nitride is in a range from about 0.2 to about 0.75.

A thickness of the second layer maybe in a range from about 200 Å to about 1200 Å.

The aluminum alloy of the first layer may include at least one among Ni, La, Nd, and Ge, and a content of a material except for aluminum in the aluminum alloy may be 1 mol % or less.

A display device according to an exemplary embodiment of the present invention includes: a substrate; a gate line disposed on the substrate; a data line insulated from and crossing the gate line; a transistor including a part of the gate line and a part of the data line; and a light-emitting element connected to the transistor, in which at least one of the gate line and the data line includes: a first layer including aluminum or an aluminum alloy; a second layer including titanium nitride; and a third layer including metallic titanium nitride, in which an N/Ti molar ratio of the metallic titanium nitride is in a range from about 0.2 to about 0.75, and a content of titanium included in the third layer is larger than a content of titanium included in the second layer.

An N/Ti molar ratio of the titanium nitride of the second layer may be in a range from about 0.8 to about 1.2.

The aluminum alloy of the first layer may include at least one among Ni, La, Nd, and Ge, and a content of a material except for aluminum in the aluminum alloy may be 1 mol % or less.

A thickness of the second layer may be in a range from about 50 Å to about 400 Å thickness of the third layer may be in a range from about 200 Å to about 1200 Å.

The first layer may be closer to the substrate than the third layer.

At least one of the gate line and the data line may not include a layer made of titanium alone.

A method for manufacturing a display device according to an exemplary embodiment of the present invention includes: depositing aluminum or an aluminum alloy to form a first layer on a substrate; forming a second layer including TiNx on the first layer by using a Ti target while supplying $N_2$ into a chamber, where x is a real number less than 4; and forming a third layer including a metallic TiNx on the second layer by using a Ti target while supplying $N_2$ into the chamber, in which a supply flow rate of $N_2$ is in a range from about 10 sccm to about 45 sccm in the forming of the third layer.

In the forming of the second layer, a supply flow rate of $N_2$ may be about 60 sccm or more.

In the forming of the second layer, the TiNx in which a molar ratio of N/Ti is in a range from about 0.8 to about 1.2 may be formed.

In the forming of the third layer, the metallic TiNx in which a molar ratio of N/Ti may be in a range from about 0.2 to about 0.75 is formed.

The forming of the second layer and the forming of the third layer may be continuously performed.

A method for manufacturing a display device according to an exemplary embodiment of the present invention includes:

depositing aluminum or an aluminum alloy on a substrate to form a first layer; forming a second layer including titanium nitride on the first layer by using a Ti target while supplying $N_2$ into a chamber; forming a third layer including a metallic titanium nitride on the second layer by using a Ti target while supplying $N_2$ into the chamber to form a gate line or a data line each comprising the first layer, the second layer and the third layer; annealing the gate line or the data line at a temperature in a rage from about 400° C. to about 580° C., without forming hillock on the first layer and without increasing resistance of the gate line or the data line; performing a cleaning process using HF solution on the gate line or the data line, without forming undercut in the gate line or the data line.

In the forming of the second layer, the titanium nitride in which a molar ratio of N/Ti may be in a range from about 0.8 to about 1.2 is formed, and in the forming of the third layer, the metallic titanium nitride in which a molar ratio of N/Ti may be in a range from about 0.2 to about 0.75 is formed.

BRIEF DESCRIPTION OF THE DRAWINGS

The above and other aspects and features of the present invention will be more clearly understood from the following detailed description, taken in conjunction with the accompanying drawings, in which.

Figure 1:
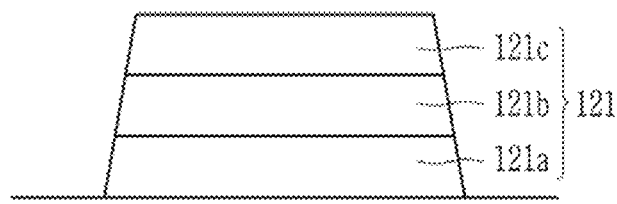
FIG. 1 is a view schematically showing a cross-section of a gate line of a display device according to an exemplary embodiment of the present invention.

Since the drawings in FIGS. 1-22 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

The present invention will be described more fully hereinafter with reference to the accompanying drawings, in which exemplary embodiments of the present invention are shown. As those skilled in the art would realize, the described exemplary embodiments may be modified in various different ways, all without departing from the spirit or scope of the present invention.

For clarity of description of the present invention, parts that are unrelated to the description are omitted, and the same reference numbers will be used throughout this specification to refer to the same or like parts.

In addition, the size and thickness of each configuration shown in the drawings are arbitrarily shown for better understanding and ease of description, but the present invention is not limited thereto.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" may mean positioned on or below the object portion, and does not necessarily mean positioned on the upper side of the object portion based on a gravitational direction.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In addition, unless explicitly described to the contrary, the word "comprise" and variations such as "comprises" or "comprising" will be understood to imply the inclusion of stated elements but not the exclusion of any other elements.

Further, in the specification, the phrase "a top plane view" means viewing the object portion from the top, and the phrase "a cross-sectional view" means viewing a cross-section of which the object portion is vertically cut from the side.

The present invention relates to a display device in which a gate line or a data line has a structure of a first layer of aluminum (Al) or an aluminum alloy/a second layer including an N-rich titanium nitride (TiNx)/a third layer including a Ti-rich metallic titanium nitride (metallic TiNx), or a structure of a first layer of aluminum or an aluminum alloy/a second layer including a Ti-rich metallic TiNx, and a manufacturing method thereof.

Now, a display device according to an exemplary embodiment of the present invention is described in detail with reference to accompanying drawings.

FIG. 1 is a view showing a gate line 121 in a display device according to an exemplary embodiment of the present invention. Referring to FIG. 1, the gate line 121 according to the present exemplary embodiment includes a first layer 121a, a second layer 121b, and a third layer 121c sequentially stacked on a substrate. For example, the first layer 121a is disposed closer to the substrate than the third layer 121c.

The first layer 121a may be aluminum or an aluminum alloy. The display device according to the present exemplary embodiment may be a display device having high resolution of 500 ppi or more. For a display device of such high resolution, it is desirable to reduce the scan delay. In other words, the gate line 121 of the display device may require low electrical resistance. For the case of the gate line containing molybdenum (Mo), the resistance is about 0.55 Ω/sq, which is higher than the resistance of aluminum, which is 0.15 Ω/sq. Thereby, when the gate line 121 includes molybdenum, a scan full swing is impossible, a horizontal line is recognized in the display device, and a random stain increases. However, since the gate line 121 according to the present exemplary embodiment includes aluminum or an aluminum alloy with low resistance instead of molybdenum, the scan full swing is possible, and a stain compensation time may be ensured. Accordingly, the display quality may be enhanced.

The first layer 121a may be aluminum or an aluminum alloy. The aluminum alloy may include at least one among, for example, nickel (Ni), Lanthanum (La), Neodymium (Nd), and germanium (Ge) with aluminum. However, a content of a material except for aluminum in the aluminum alloy may be 1 mol % or less.

When the first layer 121a includes the aluminum alloy, a hillock may be prevented from occurring as compared with the case where only aluminum is included in the first layer 121a.

Figure 2:
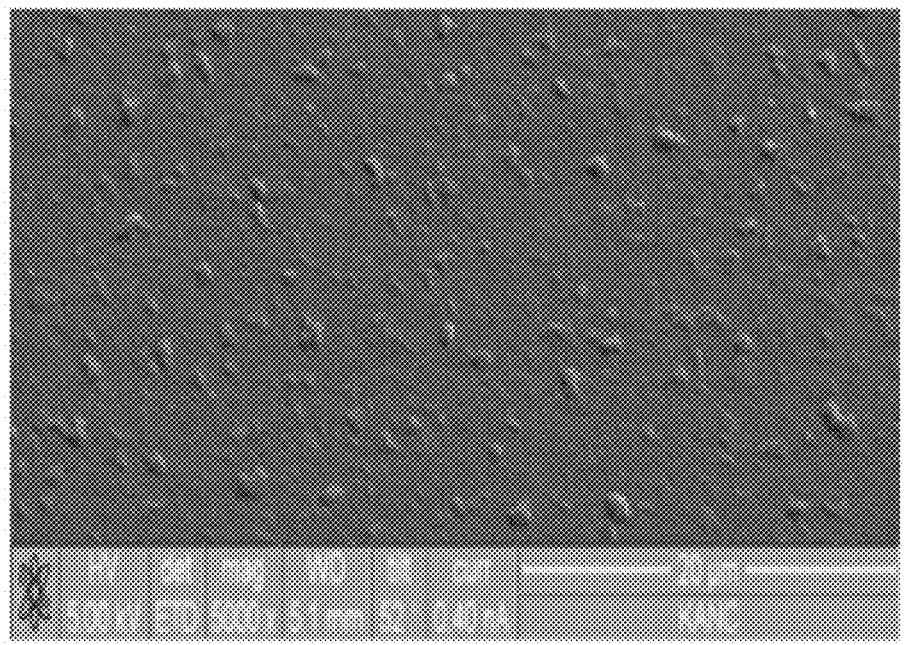
FIG. 2 is a view showing an image in which a hillock is generated on an aluminum surface.

When the gate line is formed of aluminum, the hillock may occur in a subsequent annealing process. The annealing is performed at a temperature in a range from about 400° C. to about 580° C. This heating causes a plurality of protrusions (=hillocks) formed on the aluminum surface. The hillock formation may have significant effect on the yield and reliability of semiconductor devices. For example, yield loss may occur when a short is formed between two interconnect levels due to the large hillocks. For example, the gate line 121 may form a short with adjacent conductors. With smaller hillocks, the high electrical field generated near the tip of the hillocks may nevertheless slowly degrade the isolation characteristics of the surrounding dielectric and may cause a catastrophic failure, thereby causing reliability loss within the life of the semiconductor device. FIG. 2 is a view showing an image in which the hillock occurs on the aluminum surface. However, when an aluminum alloy is used, heat resistance of the gate line is increased and the hillock may be prevented. However, if the content of the non-aluminum material in the aluminum alloy exceeds 1 mol %, the electrical resistance of the wire increases, which is not desirable.

The second layer 121b contains the N-rich TiNx. The x included in TiNx in the present specification may be 0.1 to 4, and may represent a molar ratio of N/Ti. For example, the x included in TiNx may be a real number less than 4. In the present exemplary embodiment, a molar ratio of N/Ti of TiNx in the second layer 121b may be in a range from about 0.8 to about 1.2. That is, the TiNx of the second layer 121b has an N-rich characteristic as more N than Ti may be included. For example, the molar ratio of N/Ti of the N-rich TiNx in the second layer 121b may be greater than 1. For example, the molar ratio of N/Ti of the N-rich TiNx in the second layer 121b may be in a range from about 1 to about 2. The thickness of the second layer 121b may be in a range from about 50 Å to about 400 Å.

The second layer 121b caps the first layer 121a made of aluminum or an aluminum alloy to prevent the aluminum hillock from being generated. However, when the second layer 121b only includes Ti, diffusion is generated at an interface of the first layer 121a including aluminum and the second layer 121b including titanium such that an alloy of titanium and aluminum is formed. Therefore, the resistance increases. As described above, aluminum has low resistance, and the resistance of titanium is about ten times higher. Thus, a significant increase in resistance may occur on the first layer 121a when titanium is diffused into the first layer 121a to form an alloy of titanium and aluminum.

Figure 3:
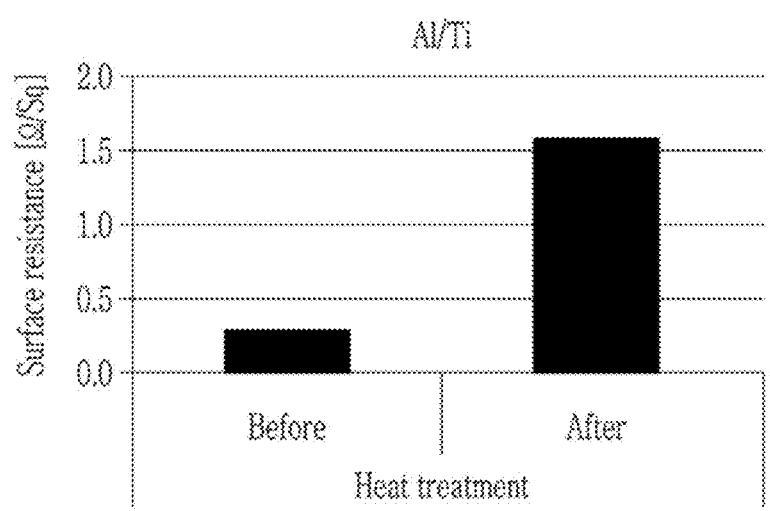
FIG. 3 is a view showing a comparison of resistance of a wire of an Al/Ti structure before and after a heat treatment.
Figure 4:
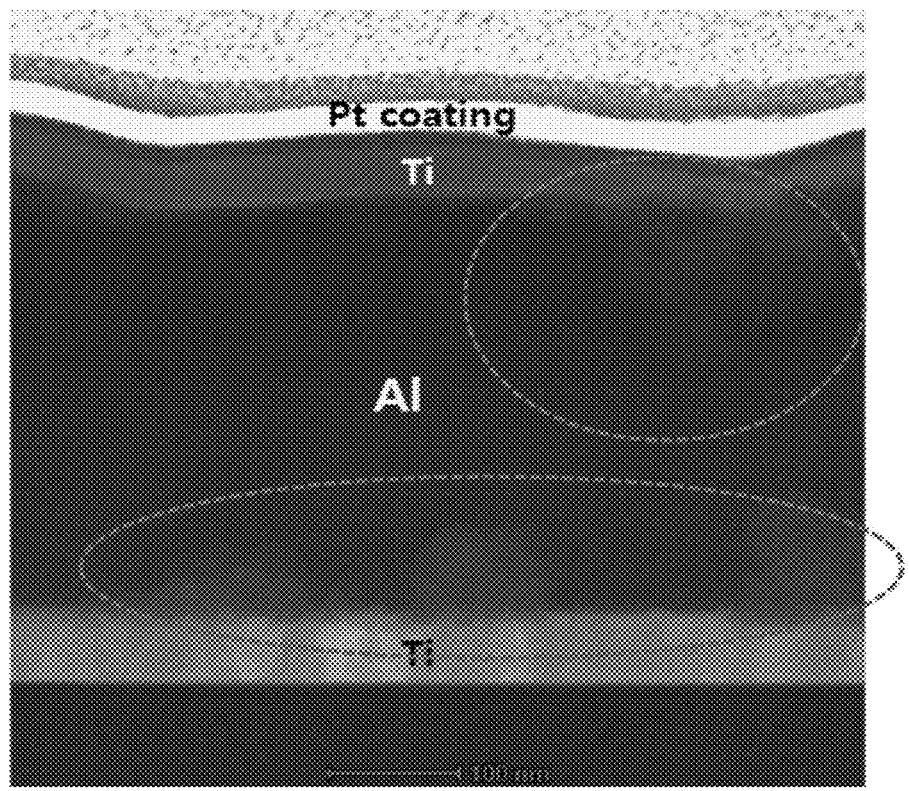
FIG. 4 is a view showing a wire cross-section of a Ti/Al/Ti structure.

FIG. 3 is a view showing a comparison of resistance for a wire of an Al/Ti structure before and after a heat treatment. Referring to FIG. 3, it may be confirmed that the resistance of the wire increases remarkably after the heat treatment compared with that before the heat treatment. This is because the alloy is formed due to the diffusion of aluminum and titanium at the aluminum and titanium interface. FIG. 4 is a view showing a wire cross-section of a Ti/Al/Ti structure. In FIG. 4, the portion indicated by a dotted line is the portion where the diffusion is generated at the interface. That is, as confirmed in FIG. 4, when aluminum is capped by titanium, the diffusion is generated at the boundary surface.

Figure 5:
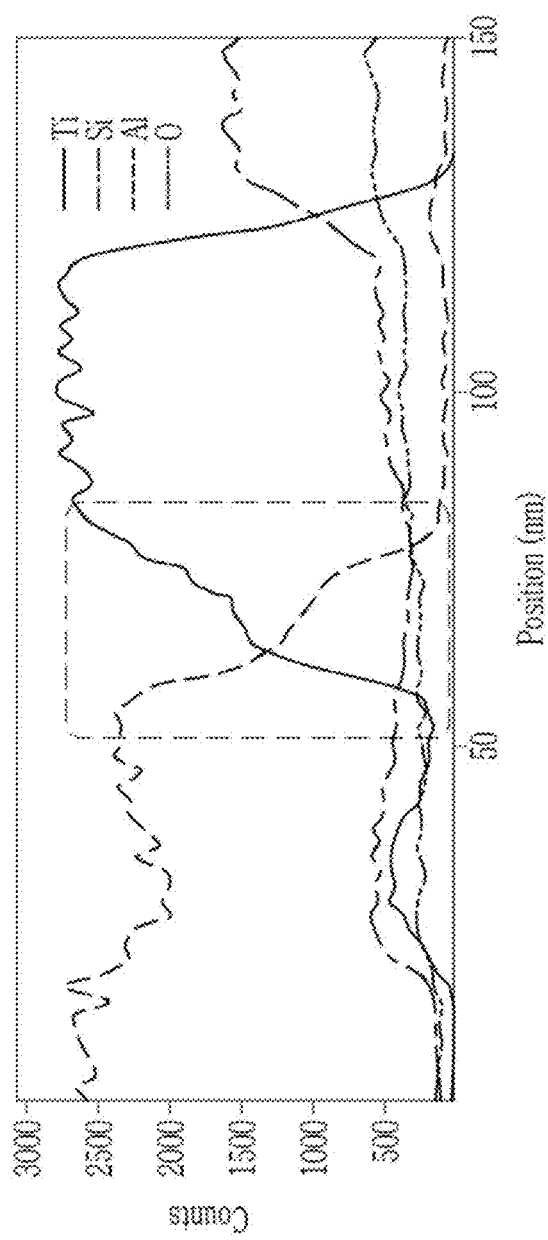
FIG. 5 is a view showing contents of Ti and Al, etc. for each region of a wire.

FIG. 5 is a view showing contents of Ti and Al, etc. for each region of a wire. Referring to FIG. 5, the diffusion occurs in the boundary region (the portion indicated by the dotted line) of aluminum and titanium such that a content ratio becomes similar. That is, when the second layer 121b made of titanium is disposed on the first layer 121a made of aluminum, it may be confirmed that the diffusion occurs at the interface of aluminum and titanium such that the resistance increases. As shown in FIG. 3, the resistance for a wire of an Al/Ti structure increases remarkably after the heat treatment compared with that before the heat treatment.

However, in the gate line according to the present exemplary embodiment, the second layer 121b made of TiNx is disposed on the first layer 121a made of aluminum. The molar ratio of N/Ti in TiNx of the second layer 121b may be in a range from about 0.8 to about 1.2. That is, the second layer 121b includes the N-rich TiNx. Accordingly, the diffusion of titanium and aluminum may be suppressed at the interface of TiNx and Al. When titanium alone is included, the diffusion between titanium of the metal and aluminum of the metal occurs, however the present exemplary embodiment includes TiNx in which a greater content of N of the non-metal is included such that the diffusion at the interface of titanium and aluminum may be suppressed. Also, by using a layer with the molar ratio of N/Ti in TiNx in the range from about 0.8 to about 1.2 as the second layer 121b according to the present exemplary embodiment instead of using a layer with the molar ratio of N/Ti below about 0.8 so as to have a lower titanium content, the formation of an alloy containing titanium and aluminum may be significantly reduced. Thus, the resistance of the first layer 121a including aluminum or an aluminum alloy may maintain low after the subsequent annealing process.

Also, in the case of the wire having the Al/Ti structure, the damage to the Al/Ti wire occurs by hydrofluoric acid (HF) in the cleaning process. To remove an oxide, etc. formed on the surface after forming the wire, the cleaning process using a cleaning solution is performed. The cleaning solution includes HF. The HF cleaning solution etches the Ti/Al wire surface exposed by a contact hole. However, since the gate line according to the present exemplary embodiment includes TiNx instead of Ti as the second layer 121b, the wire may be prevented from being damaged in the cleaning process. Hydrofluoric acid (HF) is the primary chemical commonly used to etch titanium. On the other hand, unlike titanium, the N-rich TiNx is quite stable toward the HF cleaning solution, and thus damage may not occur in the cleaning process. In general, titanium nitride is stable in most acids including HF, except nitric acid ($HNO_3$).

Figure 6:
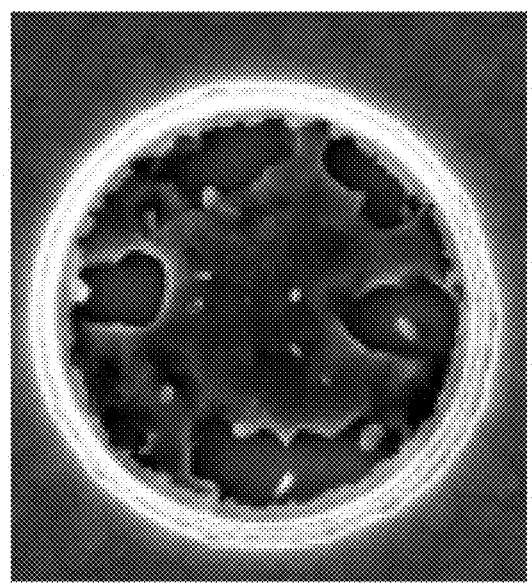
FIG. 6 is a view showing an image of a wire of an Al/Ti structure after a cleaning process using HF.
Figure 7:
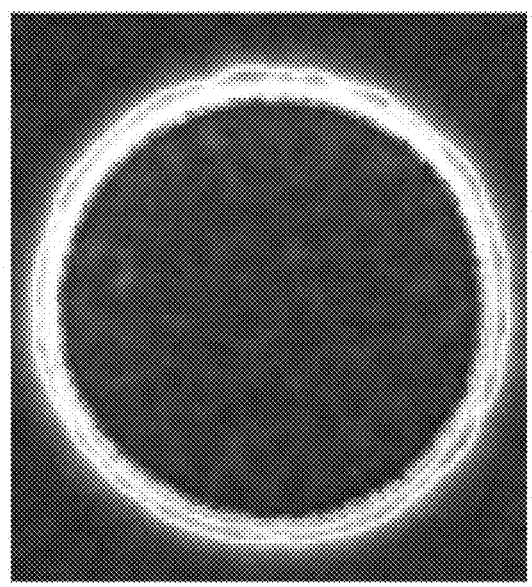
FIG. 7 is a view showing an image of a wire of an Al/TiNx structure after a cleaning process using HF.

FIG. 6 is a view showing an image of a wire of an Al/Ti structure after a cleaning process using HF. FIG. 7 is a view showing an image of a wire of an Al/TiNx structure after a cleaning process using HF. In FIG. 6 and FIG. 7, a contact hole is indicated by a circle, and the upper surface of the wire is exposed through the contact hole. Referring to FIG. 6, in the case of the wire of the Al/Ti structure, it may be confirmed that titanium and aluminum are etched and damaged after the cleaning process using HF. In FIG. 6, the damaged part is recognized as mottled. However, referring to FIG. 7, it may be confirmed that that the surface of the wire is not damaged even after the cleaning process using HF for the wire of the Al/TiNx structure.

The thickness of the second layer 121b may be in a range from about 50 Å to about 400 Å. If the thickness of the second layer 121b is less than about 50 Å, hillock formation may not be sufficiently prevented and the diffusion may occur at the boundary between the first layer 121a and the second layer 121b. Also, when the thickness of the second layer 121b is greater than about 400 Å, productivity is undesirably reduced.

Next, the third layer 121c may include metallic TiNx. In the present specification, the metallic TiNx indicates a material representing the characteristic such as a metal as the content of Ti is high. In the metallic TiNx, the molar ratio of N/Ti may be in a range from about 0.2 to about 0.75. Also, in detail, the molar ratio of N/Ti among the metallic TiNx in the third layer 121c may be in a range from about 0.2 to about 0.5. Alternatively, the molar ratio of N/Ti among the metallic TiNx in the third layer 121c may be in a range from about 0.5 to about 0.75 when the molar ratio of N/Ti in TiNx of the second layer 121b has a relatively lower value (e.g., close to or at about 0.8) and the thickness of the second layer 121b has a relatively lower value (e.g. close to or at about 50 Å) within the value ranges described above, such that the resistance of the gate line 121 will not increase after annealing. In the third layer 121c, the content of titanium may be greater than the content of nitrogen, and the metallic TiNx may exhibit more metal characteristics in this case.

The TiNx layer is formed using a Ti target in a sputtering process for the wire formation. N is supplied to the inside of the chamber in a form of an inert gas $N_2$. In other words, Ti atoms protruding from the Ti target collide with $N_2$ disposed inside the chamber and are deposited in the TiNx state. A higher content of N in TiNx may be obtained by supplying a larger flow rate of $N_2$. When $N_2$ is supplied into the chamber, the number of particles in the chamber increases as the cumulative number of manufacturing steps of the wire increases, which may lead to failure.

Figure 8:
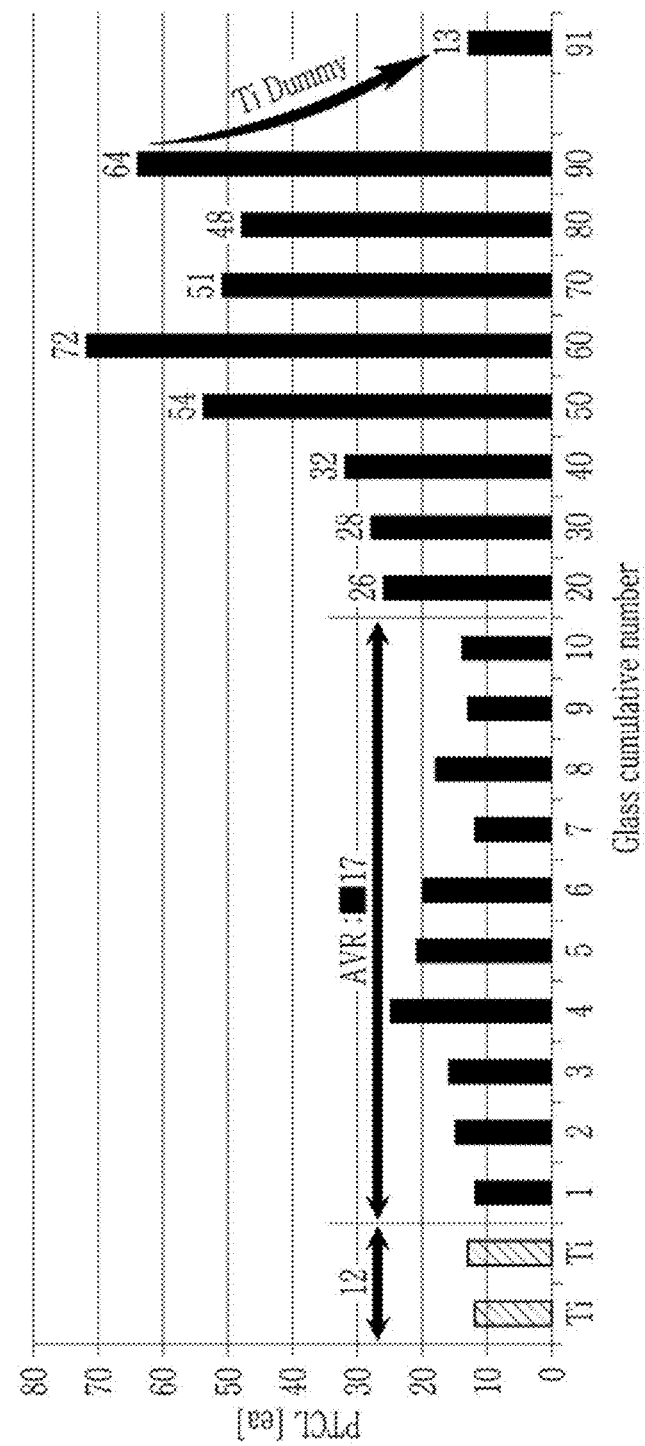
FIG. 8 is a view showing a number of particles in a chamber as a cumulative number increase.
Figure 9:
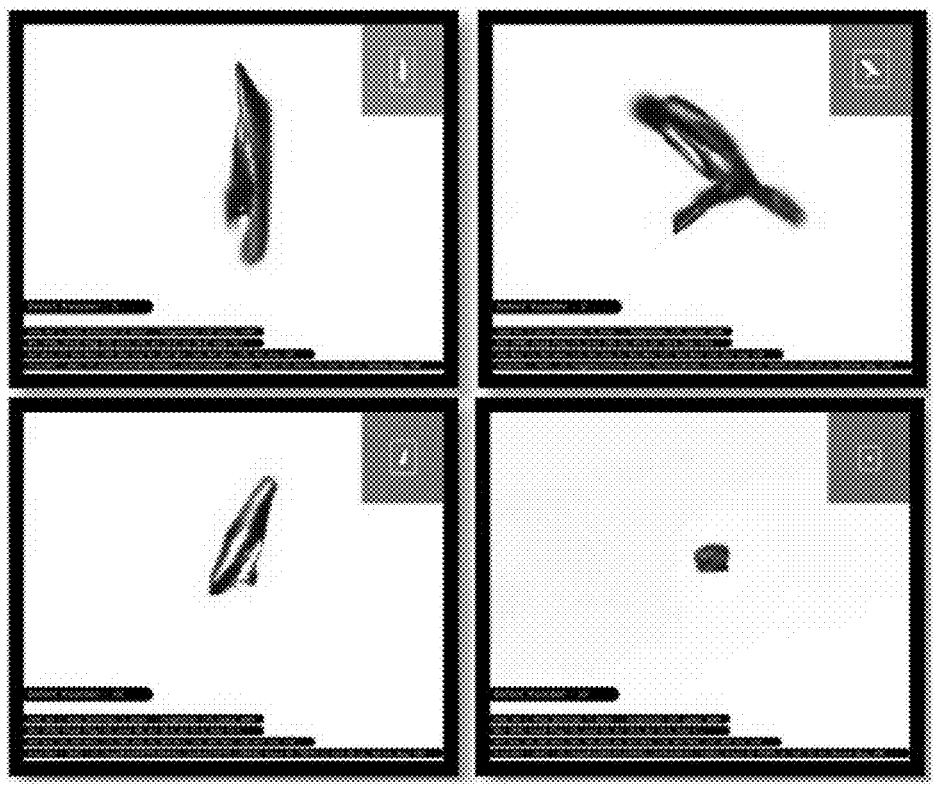
FIG. 9 is a view showing defects caused by particles.

FIG. 8 is a view showing a number of particles in a chamber as the cumulative number increase. Referring to FIG. 8, it may be confirmed that the number of particles sharply increases when the cumulative number exceeds 20. FIG. 9 shows the failure due to these particles. As shown in FIG. 9, it may be confirmed that defects of various shapes are observed because of the particles when there are more than a certain number of particles therein.

Referring to FIG. 8, to remove the particles in the chamber, a Ti dummy process of depositing only Ti without the injection of N may be performed. Referring to FIG. 8, it may be confirmed that the particles in the chamber are reduced after the Ti dummy process (64→13). However, in the manufacturing process, when performing the Ti dummy process, there are problems that the productivity is deteriorated and production efficiency is deteriorated.

The gate line 121 according to the present exemplary embodiment includes the third layer 121c made of the metallic TiNx on the second layer 121b including TiNx. The metallic TiNx has the characteristic of the metal when the content of Ti is high as the ratio of N/Ti is in a range from about 0.2 to about 0.75. Accordingly, the Ti dummy process of depositing only Ti may be omitted. That is, when depositing the metallic TiNx after manufacturing the second layer 121b including the N-rich TiNx, the particles in the chamber are removed like the Ti dummy process. In the present exemplary embodiment, the metallic TiNx of the third layer 121c is formed after the formation of the N-rich TiNx of the second layer 121b in a continuous process. In the case of the Ti dummy process, the production is stopped during the process such that the productivity is deteriorated, however in the case including the process of depositing the Ti-rich metallic TiNx, the number of particles in the chamber may be reduced without stopping the production. Accordingly, the productivity deterioration may be prevented.

Figure 10:
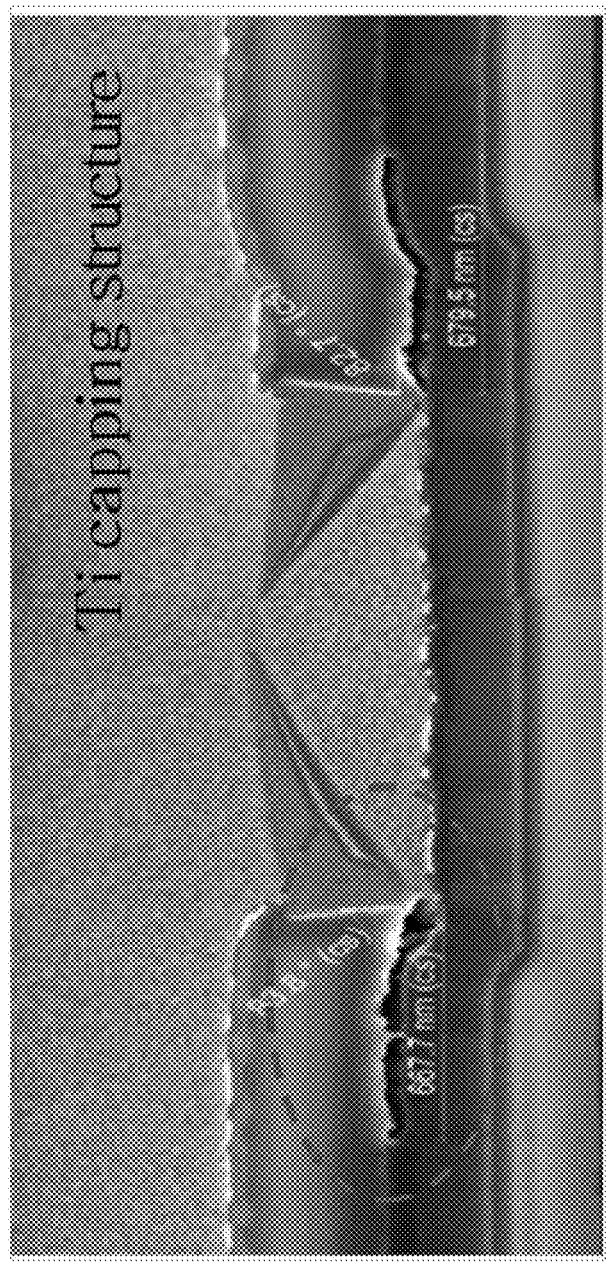
FIG. 10 is a view showing a cross-section of a wire having an Al/Ti structure after an HF cleaning process.
Figure 11:
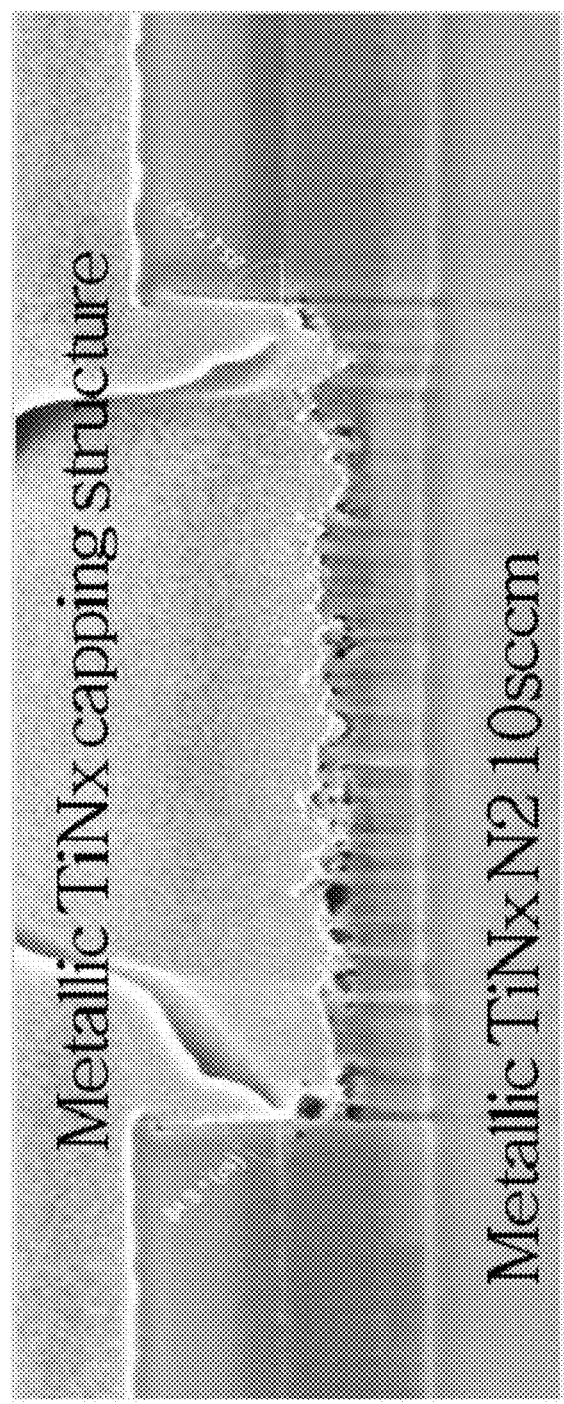
FIG. 11 to FIG. 13 are views each showing a cross-section of a wire having an Al/metallic TiNx structure after an HF cleaning process.
Figure 12:
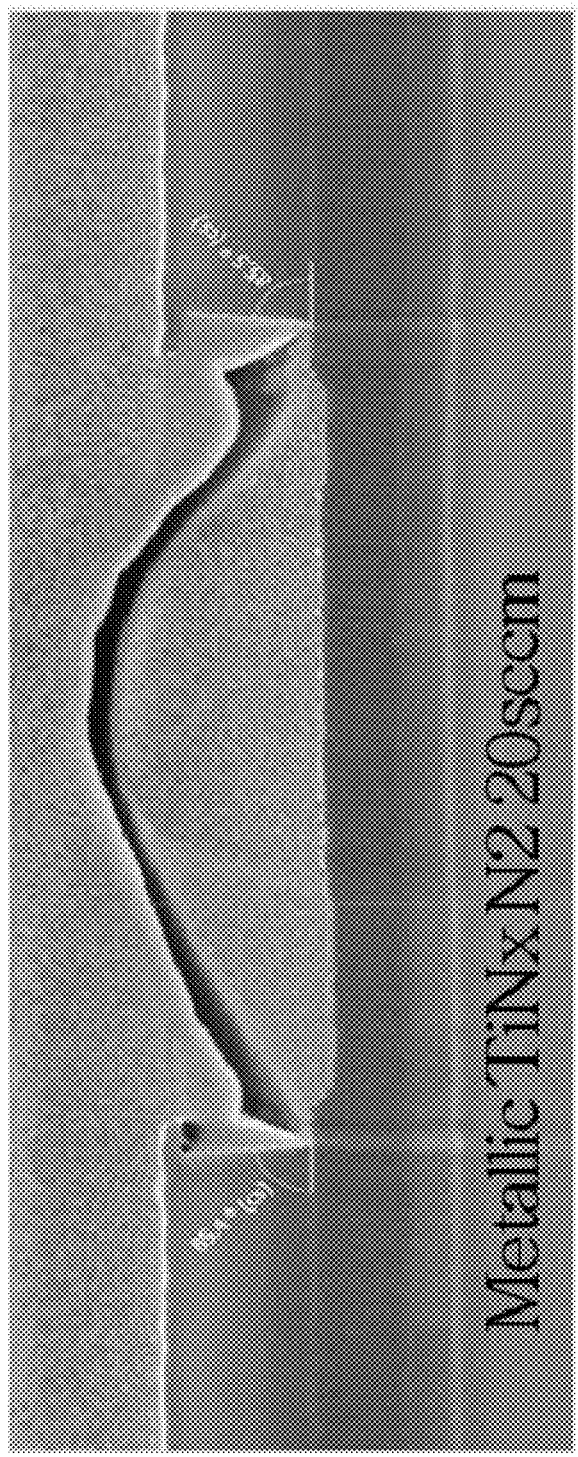
Figure 13:
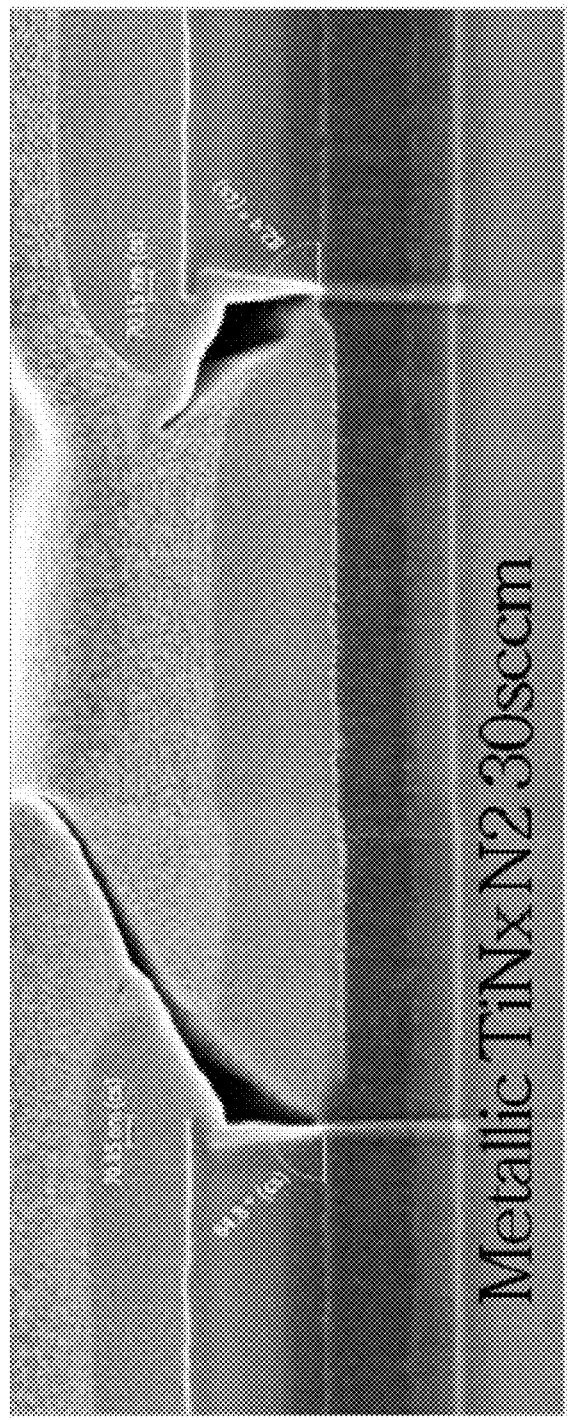

The gate line 121 including the third layer 121c including the metallic TiNx may prevent the undercut due to the HF cleaning process. FIG. 10 is a view showing a cross-section of a wire having an Al/Ti structure after an HF cleaning process. FIG. 11 to FIG. 13 are views each showing a cross-section of a wire having an Al/metallic TiNx structure after an HF cleaning process.

FIG. 11 to FIG. 13 are the exemplary embodiments in which the content of N in TiNx is different, and the flow rate of $N_2$ gas supplied during the TiNx manufacturing process is shown at the bottom of each image. A larger supply flow rate of $N_2$ means a higher content of N in TiNx.

Referring to FIG. 10, if the HF cleaning process is performed on the wire having the Al/Ti structure, the undercut caused by the cleaning solution occurs. As described above, the HF cleaning solution etches titanium. In FIG. 10, the portion where the undercut occurs is shown as a dotted line. That is, the cleaning solution penetrates the contact hole, and the cleaning solution etches the Al/Ti wire while penetrating along the side of the contact hole. Therefore, the undercut in which the wire is etched occurs even in a portion other than the contact hole. For example, the gate line 121 according to the present exemplary embodiment does not include a layer made of titanium alone, so that the damage on the gate line 121 caused by the IHF cleaning solution may not occur.

Referring to FIG. 11 to FIG. 13, in the case of the wire capped by the metallic TiNx, it may be confirmed that the undercut is not shown.

Referring to FIG. 11, the undercut does not occur when $N_2$ flows into the chamber at 10 sccm, but slight damage occurs due to I-IF on the wire surface. This is shown as a rugged surface in FIG. 11. However, referring to FIG. 12 and FIG. 13, when $N_2$ is inflowed in the chamber at 20 sccm and 30 sccm, respectively, it may be confirmed that the surface of the wire is not damaged and the undercut does not occur.

Figure 14:
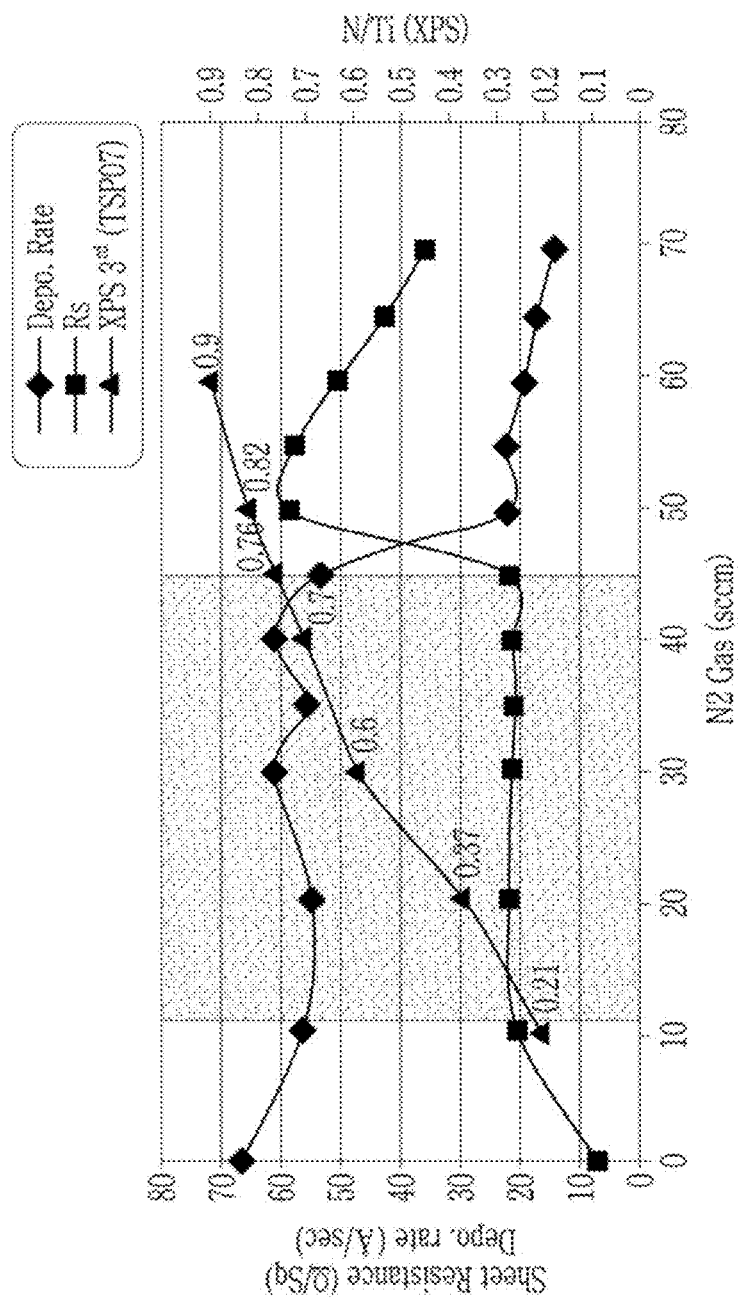
FIG. 14 is a view showing a characteristic of a TiNx depending on a $N_2$ gas content in a chamber in a metallic TiNx formation process.

FIG. 14 is a view showing a characteristic of a TiNx depending on a $N_2$ gas content in a chamber in a metallic TiNx formation process. In FIG. 14, a horizontal axis represents the content of the $N_2$ gas supplied in the chamber, and a right vertical axis represents the N/Ti ratio of the deposited TiNx layer. A left vertical axis represents a deposition speed and a sheet resistance.

Referring to FIG. 14, when the supply amount of the $N_2$ gas is in a range from 10 sccm to 45 sccm, it may be confirmed that the N/Ti molar ratio is in a range from 0.21 to 0.76. Also, it may be confirmed that sheet resistance when the N/Ti molar ratio is in the range from 0.21 to 0.76 represents the constant value. The shaded region in FIG. 14 is the region corresponding to the metallic TiNx. That is, in the region where the molar ratio of N/Ti is in the range from 0.21 to 0.76, which is the shaded region in FIG. 14, it may be confirmed that TiNx represents the characteristic of the metal.

Referring to FIGS. 11-14, when $N_2$ is inflowed in the chamber at 20 sccm and 30 sccm, respectively, the metallic TiNx films formed are not damaged by the HF cleaning solution. Since the metallic film formed with $N_2$ inflowed in the chamber at 20 sccm has the N/Ti molar ratio of 0.37, the second layer 121b made of TiNx having the molar ratio of N/Ti in TiNx being in a range from about 0.8 to about 1.2, which is higher than 0.37, will be even less likely to be damaged by the HF cleaning solution.

Figure 15:
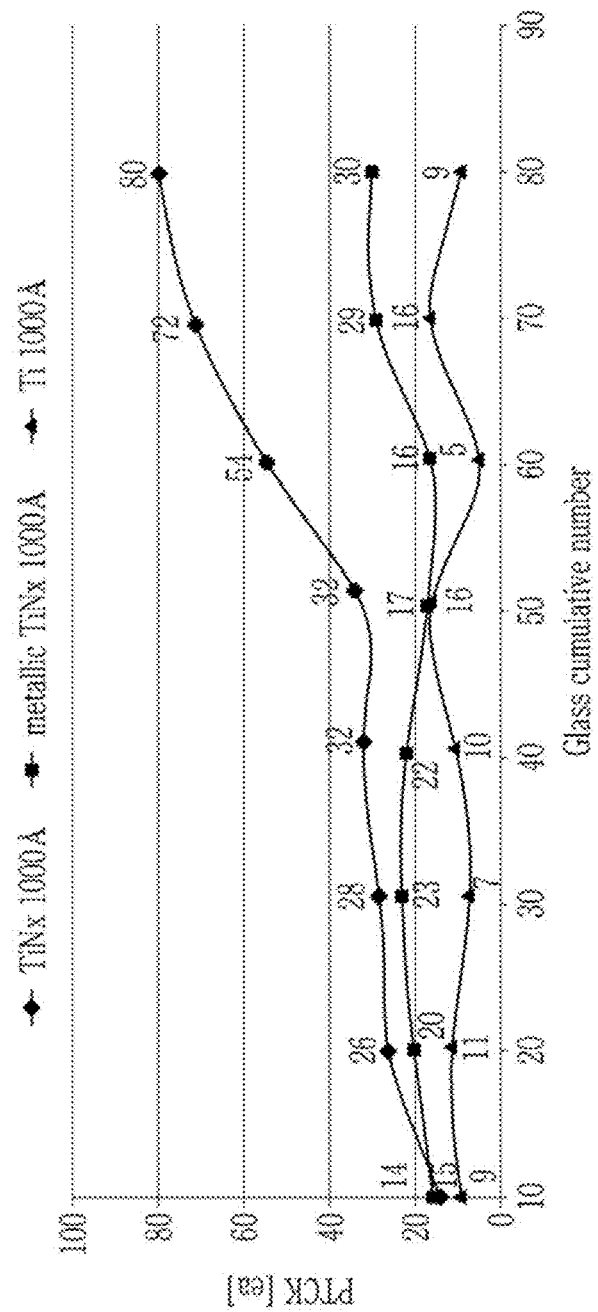
FIG. 15 is a view showing a particle number depending on a cumulative number of a case of depositing Ti alone (Ti), a case of depositing a TiNx layer (TiNx), and a case of depositing a metallic TiNx (metallic-TiNx)

FIG. 15 is a view showing a particle number depending on a cumulative number of a case of depositing Ti alone (Ti), a case of depositing a TiNx layer (TiNx), and a case of depositing a metallic TiNx (metallic-TiNx). Each layer is deposited at 1000 angstroms. Referring to FIG. 15, in the case of depositing Ti alone, even if the cumulative number increases, it may be confirmed that the particle number does not increase. Also, in the case of depositing TiNx, it may be confirmed that the number of particles increases sharply as the cumulative number increases. However, in the case of the metallic TiNx, it is confirmed that the particle number does not increase sharply even when the cumulative number increases. Therefore, it is confirmed that the particles in the chamber may be hindered through the process of depositing the metallic TiNx instead of the conventional Ti dummy deposition process.

The thickness of the third layer 121c may be in a range from about 200 Å to about 1200 Å. If the thickness of the third layer 121c is less than about 200 Å, the underlying second layer 121b and first layer 121a may not be sufficiently protected from the HF cleaning solution. If the thickness of the third layer 121c is more than about 1200 Å, the productivity is reduced.

Figure 16:
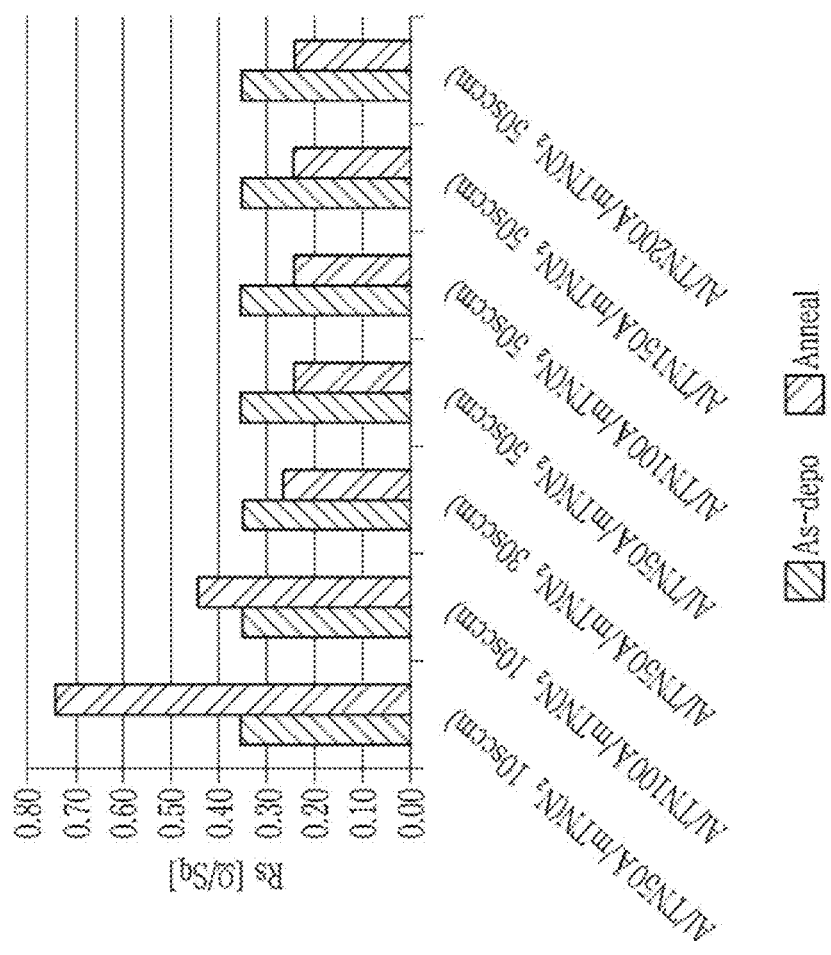
FIG. 16 is a view showing a result of measuring sheet resistance by differentiating a thickness of each layer and a content of N in a wire having an Al(Al)/TiNx(TN)/metallic TiNx(mTN) structure.

FIG. 16 is a view showing a result of measuring sheet resistance by differentiating a thickness of each layer and a content of N in a wire having an Al(Al)/TiNx(TN)/metallic TiNx(mTN) structure. In FIG. 16, the number after TN indicates the thickness (A) of the TiNx layer, and the number after mTN indicates the injection amount (sccm) of $N_2$.

Referring to FIG. 16, when the $N_2$ content of the metallic TiNx as the third layer 121c is 10 sccm, it may be confirmed that the sheet resistance increases after the annealing. However, when the $N_2$ content of the metallic TiNx is more than 30 sccm, it may be confirmed that the sheet resistance does not increase after the annealing regardless of the thickness of the second layer 121b. Referring to FIG. 14, when the $N_2$ content of the metallic TiNx is 30 sccm, the N/Ti molar ratio for the metallic TiNx as the third layer 121c is 0.6. For example, in an exemplary embodiment of the present invention, when the N/Ti molar ratio for the metallic TiNx as the third layer 121c is 0.6 or higher, it may be confirmed that the sheet resistance does not increase after the annealing when the thickness of the second layer 121b is 50 Å or higher.

Figure 17:
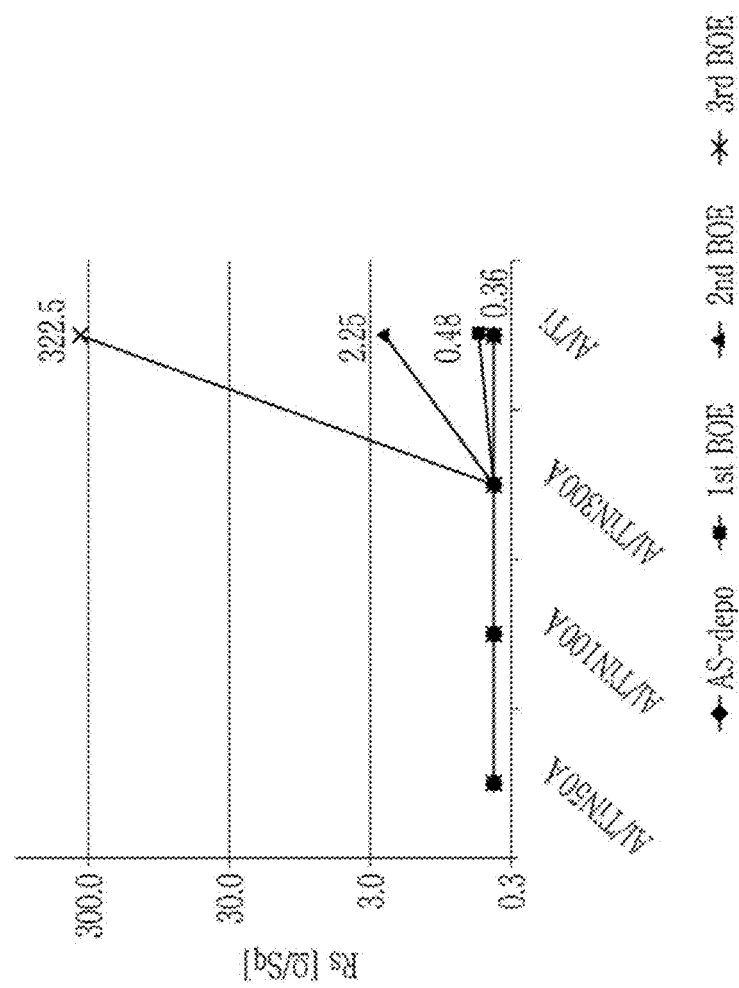
FIG. 17 is a view showing sheet resistance depending on a cleaning number in a wire having an Al/TiN structure and in a wire having an Al/Ti structure.

FIG. 17 is a view showing sheet resistance depending on a cleaning number in a wire having an Al/TiN structure and a wire having an Al/Ti structure. In FIG. 17, the number after TiN means the thickness (A). Referring to FIG. 17, compared with the Al/Ti structure, the sheet resistance does not change even if the cleaning process is repeated for the Al/TiN structure. For example, the Al/TiN structure is subjected to buffered oxide etch (BOE) with HF solution for three times as shown in FIG. 17, and the sheet resistance does not change after each BOE for the Al/TiN structure with TiN having thickness at 50 Å, 100 Å, 300 Å, respectively. As described above, titanium nitride is stable in the HF solution. That is, it may be confirmed that the damage to the wire due to the cleaning process may be prevented. However, the sheet resistance increases remarkably for the Al/Ti structure as the cleaning process is repeated.

As described above, the gate line 121 of the display device according to the present exemplary embodiment includes the first layer 121a including aluminum or an aluminum alloy, the second layer 121b including the N-rich TiNx, and the third layer 121c including the Ti-rich metallic TiNx. The resistance of the gate line is reduced by the first layer 121a including aluminum or an aluminum alloy such that the scan delay may be prevented and the hillock generation may be prevented when using the aluminum alloy. Also, the hillock generation of aluminum may be prevented by the second layer 121b including the N-rich TiNx, and the resistance increase may be prevented by minimizing the diffusion of aluminum and titanium in the boundary surface of the first layer 121a and the second layer 121b. Also, the first layer 121a may be prevented from being damaged by the cleaning solution. In addition, the third layer 121c containing the Ti-rich metallic TiNx may prevent the undercut by the cleaning solution from occurring, and even if the cumulative number increases during the wire deposition process, the particles in the chamber do not increase, so that the failure due to the particles may be prevented.

Figure 18:
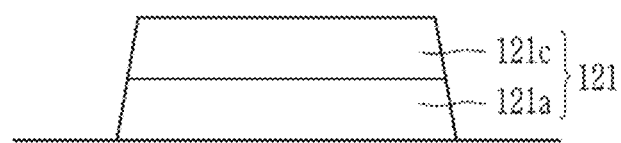
FIG. 18 is a view showing a gate line of a display device according to an exemplary embodiment of the present invention.

Next, the gate line 121 according to an exemplary embodiment of the present invention is described. FIG. 18 is a view showing a gate line 121 according to an exemplary embodiment of the present invention. Referring to FIG. 18, the gate line 121 according to the present exemplary embodiment includes the first layer 121a including aluminum or an aluminum alloy, and the third layer 121c including the Ti-rich metallic TiNx. That is, the gate line according to the exemplary embodiment of FIG. 18 is substantially the same as the gate line according to the exemplary embodiment of FIG. 1, except that the second layer 121b is omitted. A detailed description of the same constituent elements is omitted and the description for FIG. 1 is applied.

In the first layer 121a of the present exemplary embodiment, the aluminum alloy may include at least one among Ni, La, Nd, and Ge in aluminum. However, the content of the material that is not aluminum in the aluminum alloy may be about 1 mol % or less than 1 mol %. Also, the third layer 121c may include the metallic TiNx in which the molar ratio of N/Ti is in a range from about 0.2 to about 0.75, and the thickness thereof may be in a range from about 200 Å to about 1200 Å. Even if the second layer 121b is not included, the hillock formation may be prevented by the third layer 121c, and the damage and the undercut caused by the cleaning solution may be prevented. In the present exemplary embodiment compared with the exemplary embodiment of FIG. 1, the manufacturing process may be simplified since the second layer 121b is not included, and the number of particles may be further reduced in the chamber during the manufacturing. Therefore, defects due to the particles may be prevented.

In the above description, the case where the gate line 121 is composed of the three-layered structure of Al/N-rich TiNx/Ti-rich metallic TiNx or the two-layered structure of Al/Ti-rich metallic TiNx has been described, however, the present invention is not limited thereto. For example, the three-layered structure or the two-layered structure may be applied to a data line 171.

Figure 19:
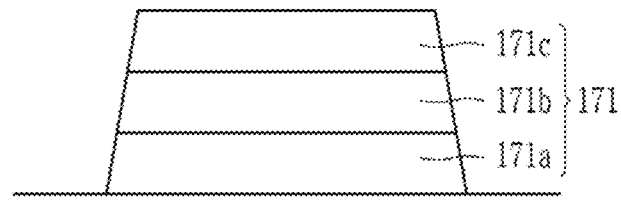
FIG. 19 is a view showing a data line of a display device according to an exemplary embodiment of the present invention.

FIG. 19 is a view showing a data line 171 of a display device according to an exemplary embodiment of the present invention. Referring to FIG. 19, the data line 171 includes a first layer 171a including aluminum or the aluminum alloy, a second layer 171b including the N-Rich TiNx, and a third layer 171c including the Ti-rich TiNx.

Figure 20:
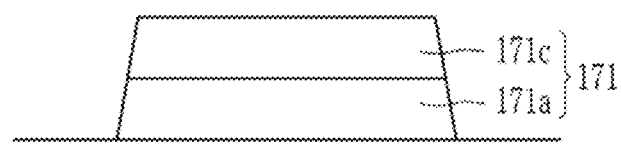
FIG. 20 is a view showing a data line of a display device according to an exemplary embodiment of the present invention.

FIG. 20 is a view showing a data line 171 of a display device according to an exemplary embodiment of the present invention. Referring to FIG. 20, the data line 171 includes the first layer 171a including aluminum or the aluminum alloy, and the third layer 171c including the Ti-rich metallic TiNx.

In FIG. 19 and FIG. 20, the description of the first layer 171a, the second layer 171b, and the third layer 171c of the data line 171 is the same as the description of the first layer 121a, the second layer 121b, and the third layer 121c of the gate line 121 in FIG. 1. The detailed description of the same contents is omitted. That is, the first layer 171a of the data line 171 may include aluminum or the aluminum alloy. The aluminum alloy may contain at least one of Ni, La, Nd, and Ge in the aluminum, and the content of the material except for aluminum in the aluminum alloy may be about 1 mol % or less than 1 mol %. The second layer 171b includes TiNx in which the molar ratio of N/Ti is in a range from about 0.8 to about 1.2, and the thickness of the second layer 171b may be in a range from about 50 Å to about 400 Å. That is, the TiNx of the second layer 171b has an N-rich characteristic as more N than Ti may be included. For example, the molar ratio of N/Ti of the N-rich TiNx in the second layer 171b may be greater than 1. For example, the molar ratio of N/Ti of the N-rich TiNx in the second layer 171b may be in a range from about 1 to about 2. The third layer 171c includes the metallic TiNx in which the molar ratio of N/Ti is in a range from about 0.2 to about 0.75, and the thickness thereof may be in a range from about 200 Å to about 1200 Å.

The effect of the data line 171 having the structure of FIG. 19 or FIG. 20 is also the same as described above. That is, the resistance of the data line may be reduced by the first layer 171a including aluminum or an aluminum alloy, thereby preventing the signal delay. Also, the hillock generation of aluminum may be prevented by the second layer 171b including the N-rich TiNx, and the diffusion in the boundary surface of the first layer 171a and the second layer 171b and the resistance increase due to the diffusion may be prevented. Also, the generation of the undercut due to the cleaning solution may be prevented by the third layer 171c including the Ti-rich metallic TiNx, and even if the cumulative number increases in the wire deposition process, the particles in the chamber do not increase such that the failure due to the particles may be prevented.

The data line 171 according to the present exemplary embodiment does not include a layer made of titanium alone, so that the damage on the data line 171 caused by the HF cleaning solution may not occur.

Next, the manufacturing method of a display device including the gate line 121 according to an exemplary embodiment of the present invention is described.

The manufacturing method of a display device including the gate line 121 according to the present exemplary embodiment includes a step of forming the first layer 121a of aluminum or an aluminum alloy, a step of forming the second layer 121b including TiNx by using a Ti target while supplying $N_2$ in the chamber, and a step of forming the third layer 121c including the metallic TiNx by using the Ti target while supplying $N_2$ into the chamber. In the step of forming the second layer 121b, the supply flow rate of $N_2$ may be about 60 sccm or more. Also, in the step of forming the third layer 121c, the supply flow rate of $N_2$ may be in a range from about 10 sccm to about 45 sccm.

In the step of forming the second layer 121b, the N-rich TiNx layer in which the molar ratio of N/Ti is in a range from about 0.8 to about 1.2 may be formed, and in the step of forming the third layer 121c, the metallic Ti-rich TiNx layer in which the molar ratio of N/Ti is in a range from about 0.2 to about 0.75 may be formed. However, the present invention is not limited thereto. For example, the TiNx of the second layer 121b may have an N-rich characteristic as more N than Ti may be included, and the molar ratio of N/Ti of the N-rich TiNx in the second layer 121b may be greater than 1. For example, the molar ratio of N/Ti of the N-rich TiNx in the second layer 121b may be in a range from about 1 to about 2.

In the present exemplary embodiment, the N-rich TiNx layer and the Ti-rich TiNx layer are formed by the continuous process. In the process of forming the N-rich TiNx layer, a large amount of $N_2$ gas flows into the chamber, and the number of particles may increase in the chamber by the $N_2$ gas. However, in the manufacturing method of the gate line 121 according to the present exemplary embodiment, since the Ti-rich TiNx layer is formed later, the number of particles in the chamber may be reduced in the present process. Therefore, the wire defect due to the particles may be prevented and the productivity may increase, because the separate Ti-dummy deposition process for reducing the number of particles is not required.

The manufacturing method of a display device including the gate line 121 according to the present exemplary embodiment may further include a step of annealing the gate line 121 at a temperature in a range from about 400° C. to about 580° C. By forming the second layer 121b, the N-rich TiNx layer with the molar ratio of N/Ti in a range from about 0.8 to about 1.2 over the first layer 121a of aluminum or an aluminum alloy, the hillock formation may be prevented, and the resistance of the gate line 121 may not increase.

The manufacturing method of a display device including the gate line 121 according to the present exemplary embodiment may further include a step of performing an HF cleaning process on the gate line 121. By forming the second layer 121b, the N-rich TiNx layer with the molar ratio of N/Ti in a range from about 0.8 to about 1.2 over the first layer 121a of aluminum or an aluminum alloy, and forming a third layer 121c, the Ti-rich TiNx layer with the molar ratio of N/Ti in a range from about 0.2 to about 0.75 over the second layer 121b, the generation of the undercut due to the HF cleaning solution may be prevented.

Next, the detailed structure of the display device to which the gate line 121 or the data line 171 according to an exemplary embodiment of the present invention is applied is described in detail with reference to accompanying drawings. However, the following structure is only an example, the present invention is not limited thereto, and the present invention may be applied to any emissive display device including the gate line 121 and the data line 171 without limitation.

Figure 21:
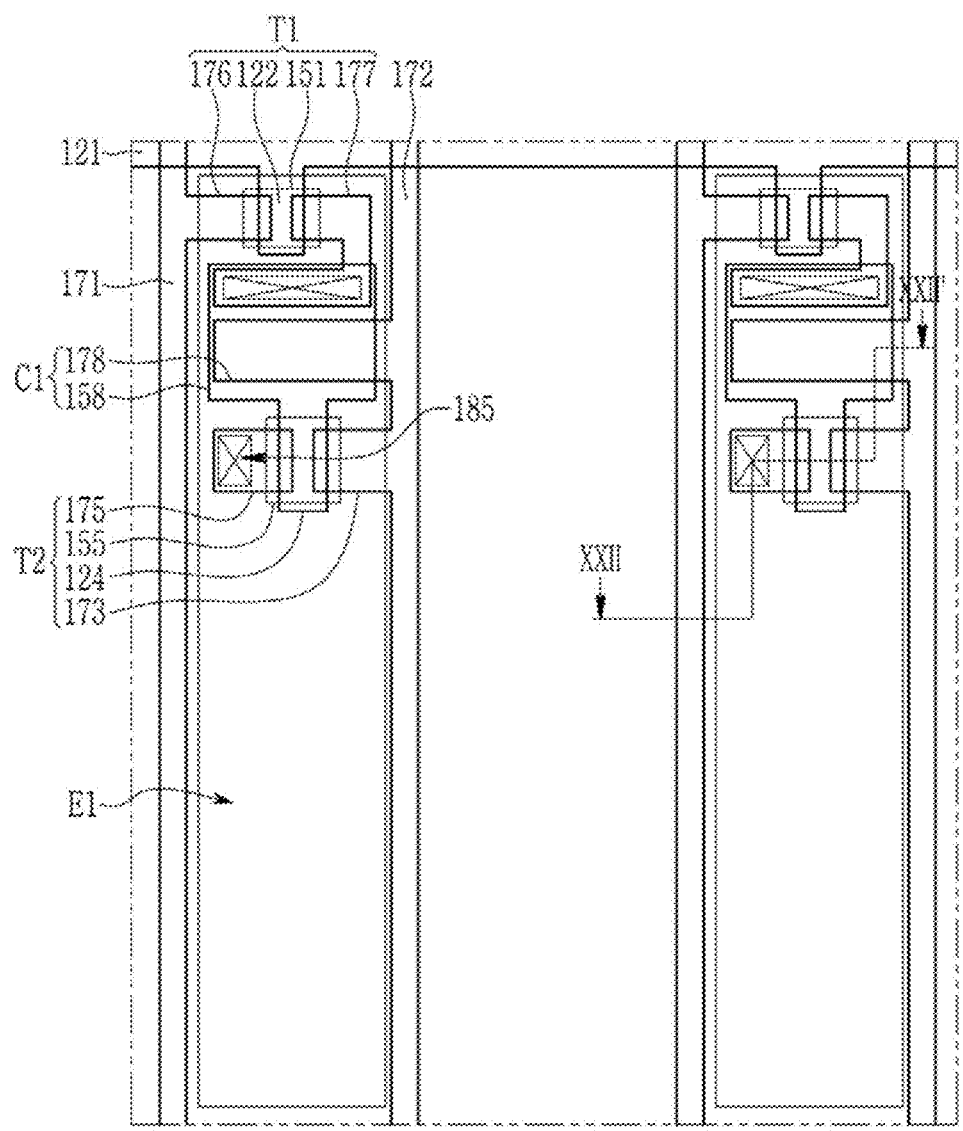
FIG. 21 is a top plan view schematically showing a display device according to an exemplary embodiment of the present invention.
Figure 22:
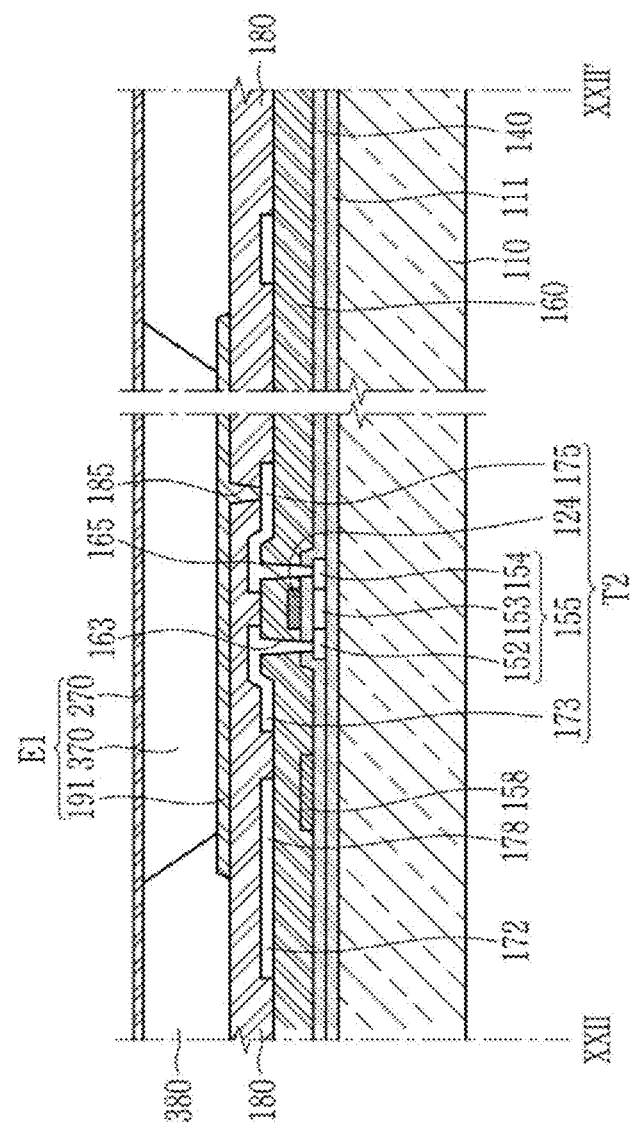
FIG. 22 is a cross-sectional view taken along line XXII-XXII' of FIG. 21.

FIG. 21 is a top plan view schematically showing a display device according to an exemplary embodiment of the present invention. FIG. 22 is a cross-sectional view taken along line XXI-XXII' of FIG. 21.

In the drawing, an active matrix (AM) type of emissive display device of a 2Tr-1Cap structure in which each pixel of the display area includes two thin film transistors (TFT) T1 and T2 and one capacitive element C1 is shown, however the present invention is not limited thereto.

The emissive display device may have three or more transistors and two or more capacitive elements in one pixel, and additional wires may be formed to have various structures. Here, the pixel is a minimum unit for displaying an image, and the display area displays an image through a plurality of pixels.

Referring to FIG. 21 and FIG. 22, the emissive display device according to the present exemplary embodiment includes a switching thin film transistor T1, a driving thin film transistor T2, a capacitive element C1, and a light-emitting element El, such as an organic light emitting element, that are respectively formed in a plurality of pixels disposed on a substrate 110. The gate line 121 disposed along one direction, and the data line 171 and a common power source line 172 insulated from and crossing the gate line 121, are disposed on the substrate 110. Here, each pixel may be defined by the gate line 121, the data line 171, and the common power source line 172 as boundaries, however the present invention is not limited thereto.

The organic light emitting element El includes a first electrode 191, a light-emitting element layer 370 formed on the first electrode 191, and a second electrode 270 formed on the light-emitting element layer 370.

Here, the first electrode 191 becomes an anode as a hole injection electrode, and the second electrode 270 becomes a cathode as an electron injection electrode. However, the present invention is not limited thereto, and according to the driving method of the emissive display device, the first electrode 191 may be the cathode and the second electrode 270 may be the anode. The first electrode 191 may be a pixel electrode, and the second electrode 270 may be a common electrode.

The light-emitting element layer 370 may include at least one among a hole injection layer, a hole transfer layer, an emission layer, an electron transfer layer, and an electron injection layer. The emission layer may include an organic emission layer, the injected holes and electrons are combined with each other so as to form excitons, and when the excitons drop from an excited state to a ground state, the emission of light occurs. Also, the emission layer may include a quantum dot.

The capacitive element C1 includes a pair of capacitive plates 158 and 178 disposed with an interlayer insulating layer 160 interposed therebetween. Here, the interlayer insulating layer 160 is a dielectric material. A capacitance is determined by charges charged to the capacitive element C1 and a voltage difference between the pair of capacitive plates 158 and 178.

The switching thin film transistor T1 includes a switching semiconductor layer 151, a switching gate electrode 122, a switching source electrode 176, and a switching drain electrode 177. The driving thin film transistor T2 includes a driving semiconductor layer 155, a driving gate electrode 124, a driving source electrode 173, and a driving drain electrode 175.

The switching thin film transistor T1 is used as a switching element for switching the pixel to emit light. The switching gate electrode 122 is connected to the gate line 121 and the switching source electrode 176 is connected to the data line 171. The switching drain electrode 177 is disposed to be separated from the switching source electrode 176 and is connected to one capacitive plate 158.

The driving thin film transistor T2 applies driving power to the first electrode 191 for the light-emitting element layer 370 of the organic light emitting element El in the switched pixel to emit light. The driving gate electrode 124 is connected to the capacitive plate 158 which is connected to the switching drain electrode 177. The driving source electrode 173 and the other capacitive plate 178 are connected to the common power source line 172.

The driving drain electrode 175 is connected to the pixel electrode 191 through a contact hole 185.

The organic light emitting device according to an exemplary embodiment of the present invention is described in more detail with reference to FIG. 22 along with FIG. 21.

A buffer layer 111 is disposed on the substrate 110. The substrate 110 may be made of, for example, glass, quartz, ceramic, plastic, etc. The buffer layer 111 may be made of, for example, a silicon nitride (SiNx), a silicon oxide (SiO$_2$), a silicon oxynitride (SiOxNy), etc., however, the present invention is not limited thereto. The x and y may be 1 to 5, respectively.

A driving semiconductor layer 155 is formed on the buffer layer 111. The driving semiconductor layer 155 may be made of various semiconductor materials such as, for example, a polycrystalline silicon layer and an amorphous silicon layer. The driving semiconductor layer 155 may include a source region 152, a channel region 153, and a drain region 154.

A gate insulating layer 140 made of, for example, a silicon nitride or a silicon oxide is positioned on the driving semiconductor layer 155. A driving gate electrode 124 and a first capacitive plate 158 are disposed on the gate insulating layer 140. In this case, the driving gate electrode 124 is positioned to overlap at least part of the driving semiconductor layer 155, in detail, the channel region 153.

The driving gate electrode 124 is disposed on a layer the same as that of the gate line 121 and includes a material the same as that of the gate line 121. The structure of the gate line 121 is as described above. The detailed description of the same constituent elements is omitted. For example, the gate line 121, as shown in FIG. 1, may include the first layer 121a including aluminum or an aluminum alloy, the second layer 121b including the N-rich TiNx, and the third layer 121c including the Ti-rich metallic TiNx. The molar ratio of N/Ti of the second layer 121b including the N-rich TiNx may be in a range from about 0.8 to about 1.2. The molar ratio of N/Ti of the third layer 121c including the Ti-rich metallic TiNx may be in a range from about 0.2 to about 0.75. Also, the gate line 121, as shown in FIG. 18, may include the first layer 121a including aluminum or an aluminum alloy and the third layer 121c including the Ti-rich metallic TiNx.

An interlayer insulating layer 160 covering the driving gate electrode 124 is disposed on the gate insulating layer 140. The interlayer insulating layer 160 may be formed of, for example, a silicon nitride or a silicon oxide, like the gate insulating layer 140. The gate insulating layer 140 and the interlayer insulating layer 160 have a first contact hole 163 and a second contact hole 165 exposing the source region 152 and the drain region 154 of the driving semiconductor layer 155.

The driving source electrode 173, the driving drain electrode 175, the data line 171, the common power source line 172, and the second capacitive plate 178 are disposed on the interlayer insulating layer 160. The driving source electrode 173 and the driving drain electrode 175 are connected to the source region 152 and the drain region 154 of the driving semiconductor layer 155 through the first contact hole 163 and the second contact hole 165, respectively. The driving source electrode 173 and the driving drain electrode 175 are disposed on a layer the same layer as that of the data line 171, and include a material the same as that of the data line 171. The structure of the data line 171 is as described above. The detailed description of the same constituent elements is omitted. That is, the data line 171, as shown in FIG. 19, may include the first layer 171a including aluminum or an aluminum alloy, the second layer 171b including the N-rich TiNx, and the third layer 171c including the Ti-rich metallic TiNx. The molar ratio of N/Ti of the second layer 171b including the N-rich TiNx may be in a range from about 0.8 to about 1.2. The molar ratio of N/Ti of the third layer 171c including the Ti-rich metallic TiNx may be in a range from about 0.2 to about 0.75. Also, the data line 171, as shown in FIG. 20, may include the first layer 171a including aluminum or an aluminum alloy and the third layer 171c including the Ti-rich metallic TiNx.

An insulating layer 180 covering the driving source electrode 173 and the driving drain electrode 175 is disposed on the interlayer insulating layer 160. The insulating layer 180 may include the organic material such as, for example, an acryl-based polymer or an imide-based polymer.

The insulating layer 180 has a contact hole 185. The first electrode 191 is disposed on the insulating layer 180. The first electrode 191 may be the pixel electrode. The first electrode 191 is connected to the driving drain electrode 175 through the contact hole 185.

A partition 380 is disposed on the insulating layer 180. The light-emitting element layer 370 is disposed to overlap the first electrode 191, and the second electrode 270 is disposed to overlap the light-emitting element layer 370. The light-emitting element layer 370 may include at least one among the hole injection layer, the hole transfer layer, the emission layer, the electron transfer layer, and the electron injection layer. The second electrode 270 may be the common electrode. The light-emitting element El may include the first electrode 191, the light-emitting element layer 370, and the second electrode 270.

While this present invention has been described in connection with what is presently considered to be practical exemplary embodiments, it is to be understood that the present invention is not limited to the disclosed exemplary embodiments. On the contrary, it is intended to cover various modifications and equivalent arrangements included within the spirit and scope of the present invention as defined in the appended claims.

What is claimed is:

1. A display device comprising:
a substrate;
a gate line disposed on the substrate;
a transistor including a part of the gate line; and
a light-emitting element connected to the transistor,
wherein the gate line includes:
a first layer including an aluminum alloy;
a second layer including titanium nitride; and
a third layer including metallic titanium nitride,
wherein an N/Ti molar ratio of the metallic titanium nitride is in a range from about 0.2 to about 0.75,
the third layer is in direct contact with the second layer,
the second layer is interposed between the first layer and the third layer,
in the second layer, a content of nitrogen is higher than a content of titanium,
in the third layer, a content of titanium is higher than a content of nitrogen,
the first layer is disposed closer to the substrate than the third layer,
the aluminum alloy of the first layer includes at least one among Ni, La, Nd, and Ge,
a content of a material except for aluminum in the aluminum alloy is 1 mol % or less, and greater than 0 mol %, and
the aluminum alloy of the first layer is not in direct contact with the metallic titanium nitride of the third layer to prevent an increase in resistance by minimizing diffusion of titanium into the aluminum alloy of the first layer.

2. The display device of claim 1, wherein
an N/Ti molar ratio of the titanium nitride of the second layer is greater than 1.0 and is in a range from about 1.0 to about 1.2.

3. The display device of claim 1, wherein
a thickness of the second layer is in a range from about 50 Å to about 400 Å.

4. The display device of claim 1, wherein
a thickness of the third layer is in a range from about 200 Å to about 1200 Å.

5. The display device of claim 1, wherein
the content of titanium included in the third layer is larger than the content of titanium included in the second layer.

6. The display device of claim 1, wherein
the gate line does not include a layer made of titanium alone.

* * * * *